United States Patent
Tsai

(10) Patent No.: US 10,063,233 B2
(45) Date of Patent: Aug. 28, 2018

(54) METHOD OF OPERATING A PULL-UP CIRCUIT

(71) Applicant: TAIWAN SEMICONDUCTOR MANUFACTURING COMPANY, LTD., Hsinchu (TW)

(72) Inventor: Ming Hsien Tsai, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 57 days.

(21) Appl. No.: 15/219,599

(22) Filed: Jul. 26, 2016

(65) Prior Publication Data

US 2016/0336939 A1 Nov. 17, 2016

Related U.S. Application Data

(62) Division of application No. 14/303,250, filed on Jun. 12, 2014, now Pat. No. 9,432,005.

(51) Int. Cl.
*H03K 5/003* (2006.01)
*H03K 19/0175* (2006.01)

(52) U.S. Cl.
CPC ..... *H03K 19/017509* (2013.01); *H03K 5/003* (2013.01)

(58) Field of Classification Search
CPC .............. H03K 5/003; H03K 19/017509
USPC .......... 326/62; 327/306, 309, 318, 319, 321, 327/323, 333
See application file for complete search history.

(56) References Cited

U.S. PATENT DOCUMENTS

| 5,781,034 A | 7/1998 | Rees |
| 6,294,943 B1 | 9/2001 | Wall et al. |
| 2003/0098714 A1 | 5/2003 | Clark |
| 2006/0022735 A1 | 2/2006 | Chen et al. |
| 2007/0152738 A1 | 7/2007 | Stopel |
| 2014/0103966 A1 | 4/2014 | Wang |
| 2014/0160000 A1* | 6/2014 | Ma .......................... G11C 19/28 345/100 |
| 2015/0043703 A1* | 2/2015 | Tan .......................... G11C 19/28 377/68 |
| 2015/0229304 A1* | 8/2015 | Suzuki .................. H03K 17/223 327/143 |

OTHER PUBLICATIONS

Morgan, Mark et al., "The Active Fail-Safe Feature of the SN65LBDS32A", Texas Instruments Incorporated, Analog Applications Journal, Analog and Mixed Signal Products, Nov. 2000, pp. 35-39.
Lin, J.-F., "Lowe-Power Pulse-Triggered Flip-Flop Design Using Gated Pull-Up Control Scheme", Electronics Letters, Nov. 24, 2011, vol. 47, No. 24.

* cited by examiner

*Primary Examiner* — William Hernandez
(74) *Attorney, Agent, or Firm* — Hauptman Ham, LLP

(57) ABSTRACT

A method of operating a pull-up circuit includes turning off a first transistor of the pull-up circuit during a failsafe period by a feedback signal, the feedback signal being received by way of a feedback circuit; isolating the first transistor from the feedback circuit during a pull-up period; and coupling or isolating a control terminal of the first transistor and a control terminal of a second transistor of the pull-up circuit during the pull-up period by a first switch.

20 Claims, 7 Drawing Sheets

US 10,063,233 B2

METHOD OF OPERATING A PULL-UP CIRCUIT

PRIORITY CLAIM

The present application is a divisional of U.S. application Ser. No. 14/303,250, filed Jun. 12, 2014, now U.S. Pat. No. 9,432,005, issued Aug. 30, 2016, which is incorporated herein by reference in its entirety.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking a semiconductor process node (e.g., shrinking the process node toward a sub-20 nanometer (nm) node).

Shrinking the semiconductor process node often involves reducing an operating voltage and a current consumption of an electronic circuit developed in the semiconductor process node. For example, the operating voltages of some electronic circuits have been reduced from 5V to 3.3V, 2.5V, 1.8V, and even 0.9V. A wave of mobile device popularity has increased pressure in the industry to develop low power consumption circuits that drain miniscule operating current from batteries that power the mobile devices. Lower operating current extends battery life of battery-operated mobile devices, such as smartphones, tablet computers, ultrabooks, and the like.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely pull-up circuits and related methods. Other embodiments may also be applied, however, to other types of pull-up circuits.

Throughout the various figures and discussion, like reference numbers refer to like objects or components. Also, although singular components may be depicted throughout some of the figures, this is for simplicity of illustration and ease of discussion. A person having ordinary skill in the art will readily appreciate that such discussion and depiction can be and usually is applicable for many components within a structure.

In the following disclosure, a novel pull-up circuit and method are introduced. In at least one embodiment, the pull-up circuit uses a control circuit and level shifter to allow failsafe mode and near full-swing output voltage.

Figure 1:
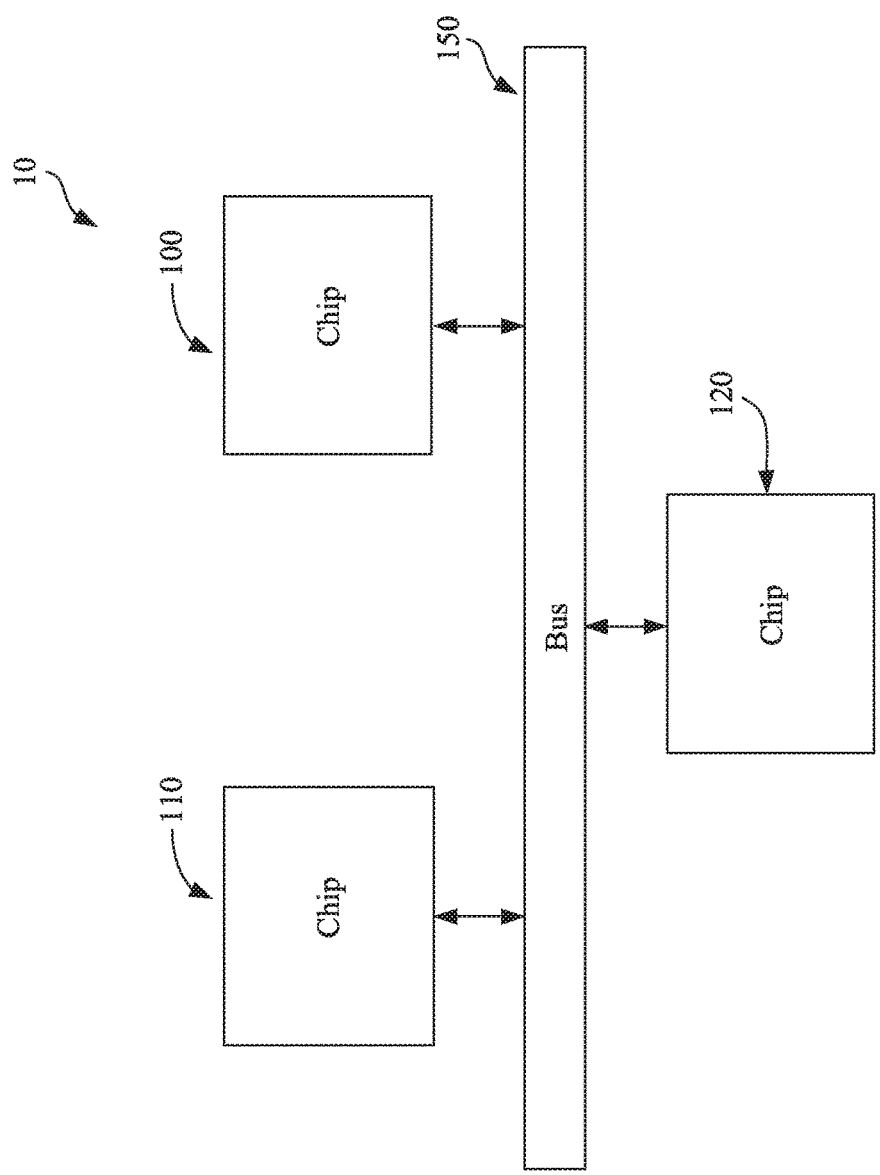
FIG. 1 is a diagram of a device, in accordance with one or more embodiments.

FIG. 1 is a diagram of a device 10, in accordance with one or more embodiments. In some embodiments, the device 10 is a mobile device (e.g., a smartphone or tablet computer), a sensor node, an automobile, or other suitable device. In some embodiments, the device 10 includes integrated circuit (IC) chips (or dies) 100, 110, 120 that communicate electronically over at least one signal bus 150 (or simply "bus 150"). In some embodiments, the IC chips 100, 110, 120 are arranged in a single package on an interposer, in a stacking configuration, or the like. In some embodiments, at least one of the IC chips 100, 110, 120 (e.g., the IC chip 100) includes a failsafe digital input/output (I/O). The failsafe digital I/O is circuitry that prevents current flow into the IC chip (e.g., the IC chip 100) from the signal bus 150 when the IC chip is off (powered down, turned off, not powered). In some embodiments, fewer or more than the three IC chips 100, 110, 120 are included in the device 10. Failsafe means that circuit reliability is maintained, even in the presence of supply voltage open, or high voltage signal levels at I/O pins. Failsafe conditions include, but are not limited to, open input pins, idle bus, and shorted input pins. One type of failsafe mechanism drives input or output pins to a predefined voltage in the presence of one or more of the failsafe conditions. For example, a failsafe mechanism of the failsafe digital I/O is optionally capable of driving an output pin to logic HIGH when input pins are open or shorted. In another example, a receiver (e.g., the IC chip 110) is optionally connected to an idle bus with a driver thereof in a high-impedance state (e.g., the IC chip 120 powered down).

Figure 2:
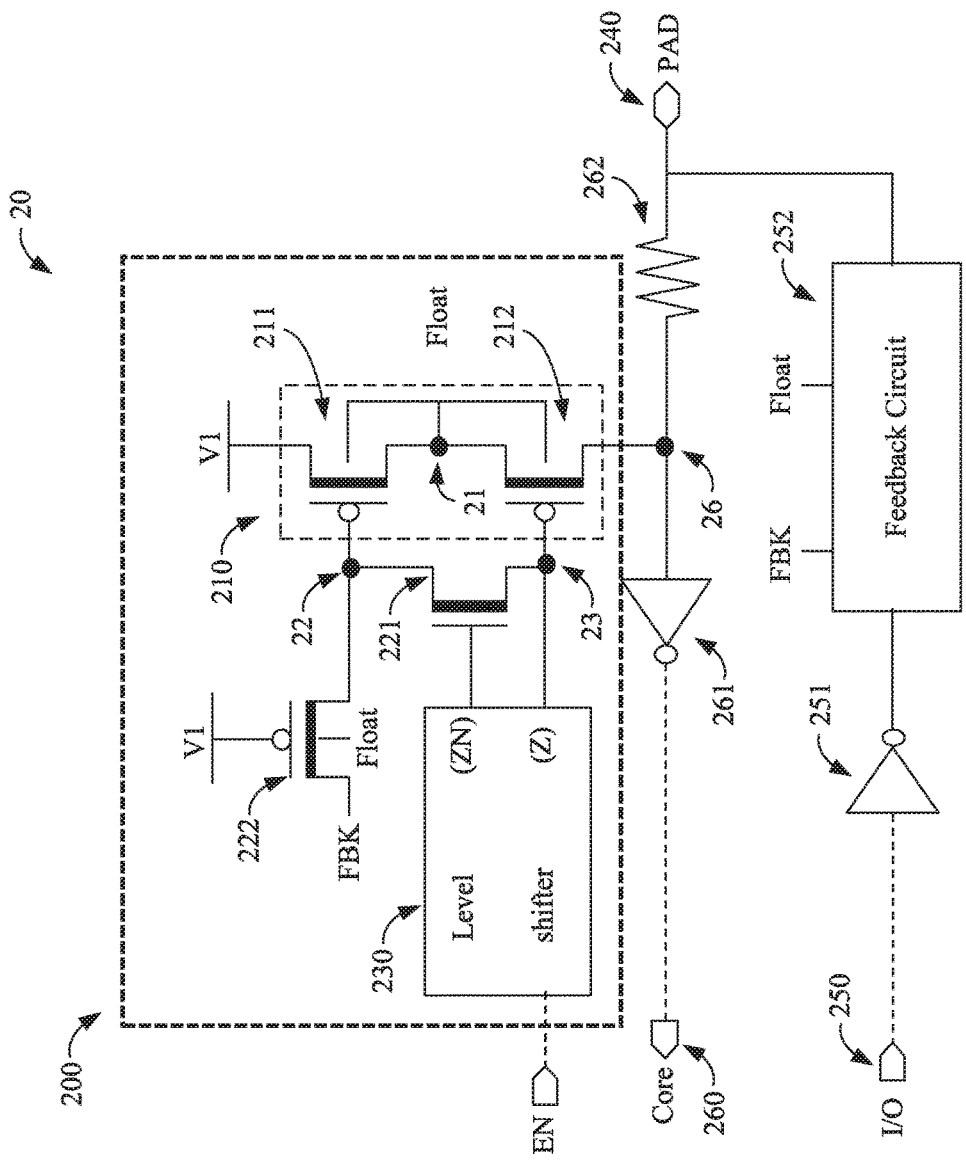
FIG. 2 is a diagram of a circuit in accordance with one or more embodiments.

FIG. 2 is a diagram of a circuit 20, in accordance with one or more embodiments. In some embodiments, the circuit 20 is included in at least one of the IC chips 100, 110, 120 of FIG. 1. In some embodiments, the circuit 20 is electrically coupled to core circuitry at a node 260, and to input/output (I/O) circuitry at a node 250. Core circuitry is, for example, one or more electronic circuits that are designed to operate reliably at a low operating voltage (e.g., 0.9 Volts in a 28 nanometer process). I/O circuitry is, for example, one or more electronic circuits that are designed to operate reliably at a higher operating voltage (or I/O voltage) than the low operating voltage (or core voltage). As a non-limiting example, the I/O voltage in a 28 nanometer process is capable of being in a range of 1.5 Volts to 3.0 Volts, or higher.

In some embodiments, the circuit 20 is electrically coupled to external circuitry through a pad 240. A pull-up unit 200 is electrically coupled to the pad 240. In some embodiments, a resistor 262 is coupled to the pull-up unit 200 and the pad 240. A first terminal of the resistor 262 is electrically coupled to the pad 240, and a second terminal of the resistor 262 is electrically coupled to the pull-up unit 200

(at a node 26). A buffer circuit 261 is electrically coupled to the second terminal of the resistor 262, and to the core circuitry (through the node 260). In some embodiments, the buffer circuit 261 includes at least one inverter.

In some embodiments, the pull-up unit 200 includes a pull-up circuit 210. A first transistor 211 of the pull-up circuit 210 has a first electrode electrically coupled to a node 21. A second electrode of the first transistor 211 is electrically coupled to a first power node. In some embodiments, the first power node is electrically coupled to a first voltage source (e.g., a bandgap reference) that provides a first voltage V1. A control electrode of the first transistor 211 is electrically coupled to a node 22. In some embodiments, the first transistor 211 is a P-type metal-oxide-semiconductor (PMOS) transistor.

A second transistor 212 of the pull-up circuit 210 has a first electrode electrically coupled to the second terminal of the resistor 262. A second electrode of the second transistor 212 is electrically coupled to the first electrode of the first transistor 211 (node 21). A control electrode of the second transistor 212 is electrically coupled to a node 23. In some embodiments, the second transistor 212 is a PMOS transistor.

In some embodiments, a bulk of the transistors 211, 212 is floating. In some embodiments, the first electrode of the first transistor 211 and the second electrode of the second transistor 212 (node 21) are floating.

A first switch 221 has a first terminal electrically coupled to the control terminal of the first transistor 211. A second terminal of the first switch 221 is electrically coupled to the control terminal of the second transistor 212 (node 23). A control terminal of the first switch 221 is electrically coupled to a level shifter 230. In some embodiments, the first switch 221 is an N-type metal-oxide-semiconductor (NMOS) transistor.

A second switch 222 has a first terminal electrically coupled to the control terminal of the first transistor 211. A second terminal of the second switch 222 is electrically coupled to a feedback circuit 252. A control terminal of the second switch 222 is electrically coupled to a power node. In some embodiments, the control terminal of the second switch 222 is electrically coupled to the first power node. In some embodiments, the control terminal of the second switch 222 is electrically coupled to a second power node. In some embodiments, the second power node is electrically coupled to a second voltage source (e.g., a band gap reference) that provides a second voltage V2. In some embodiments, the second voltage V2 is lower than the first voltage V1. As a non-limiting example, the first voltage V1 may be an I/O voltage, and the second voltage V2 may be a core voltage. In some embodiments, a bulk of the second switch 222 is floating. In some embodiments, the second switch 222 is a PMOS transistor.

The level shifter 230 has a first terminal for receiving an enable signal EN. The level shifter 230 shifts voltage range enable signal EN to generate two signals Z, ZN in a voltage range that is different from the voltage range of the enable signal EN. As a non-limiting example, the enable signal EN may be in a range from 0 Volts to the core voltage (e.g., 0.9 Volts), and the two signals Z, ZN may be in a range from 0 Volts to the I/O voltage (e.g., 1.8 Volts).

The feedback circuit 252 has a first terminal electrically coupled to the pad 240. A second terminal of the feedback circuit 252 is electrically coupled to a buffer circuit 251. In some embodiments, the buffer circuit 251 is an inverter. A third terminal of the feedback circuit 252 is floating. A fourth terminal of the feedback circuit is electrically coupled to the second terminal of the second switch 222. A feedback signal FBK is generated by the feedback circuit 252 at the fourth terminal. In some embodiments, the feedback circuit 252 includes an RC (resistor-capacitor) network.

Figure 3:
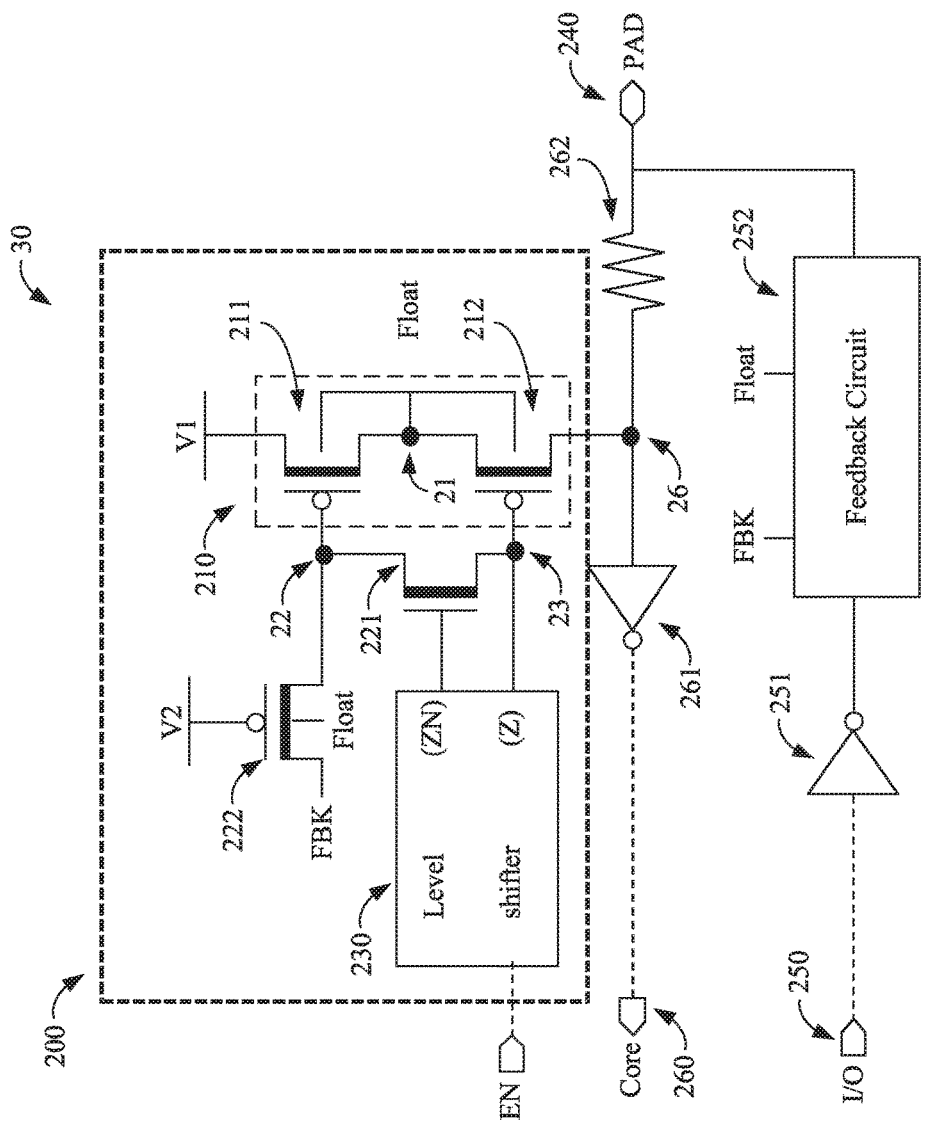
FIG. 3 is a diagram of a circuit in accordance with one or more embodiments.

FIG. 3 is a diagram of a circuit 30, in accordance with one or more embodiments. Like reference numerals in FIG. 2 and FIG. 3 refer to like elements. In some embodiments, the control terminal of the second switch 222 is electrically coupled to the second voltage source.

Figure 4:
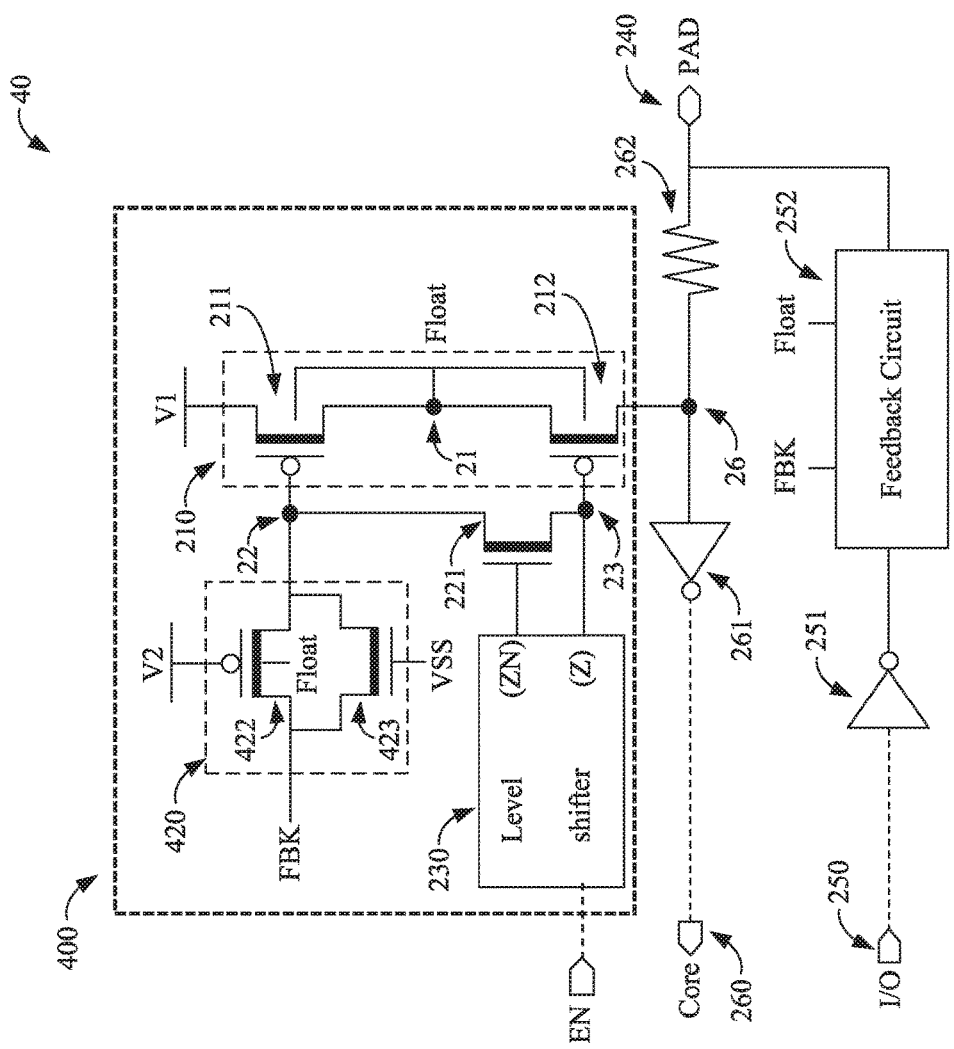
FIG. 4 is a diagram of a circuit in accordance with one or more embodiments.

FIG. 4 is a diagram of a circuit 40, in accordance with one or more embodiments. Like reference numerals in FIGS. 2 to 4 refer to like elements. In some embodiments, the control electrode of the first transistor 211 is electrically coupled to the feedback circuit 252 through a pass gate 420. A third transistor 422 of the pass gate 420 has a first electrode electrically coupled to the control electrode of the first transistor 211. A second electrode of the third transistor 422 is electrically coupled to the fourth terminal of the feedback circuit 252. A control terminal of the third transistor 422 is electrically coupled to the first or second power node. A bulk of the third transistor 422 is floating.

A fourth transistor 423 of the pass gate 420 has a first electrode electrically coupled to the control electrode of the first transistor 211 and the first electrode of the third transistor 422. A second electrode of the fourth transistor 423 is electrically coupled to the second electrode of the third transistor 422 and the fourth terminal of the feedback circuit 252. A control electrode of the fourth transistor 423 is electrically coupled to a third power node. In some embodiments, the third power node is electrically coupled to a third voltage source. In some embodiments, the third voltage source is ground. In some embodiments, the third voltage source provides a third voltage (VSS) that is lower than the first and second voltages V1, V2.

Figure 5:
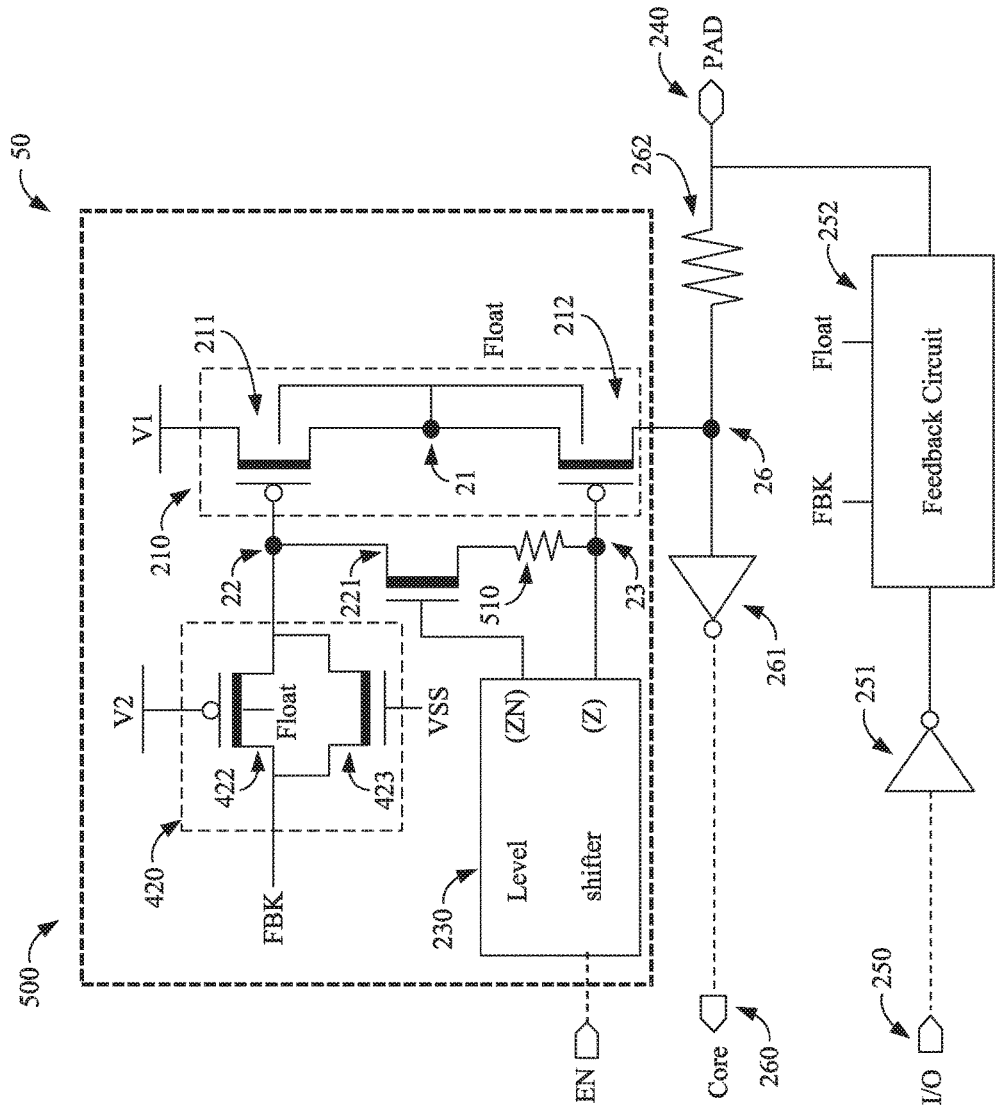
FIG. 5 is a diagram of a circuit in accordance with one or more embodiments.

FIG. 5 is a diagram of a circuit 50, in accordance with one or more embodiments. Like reference numerals in FIGS. 2 to 5 refer to like elements. In some embodiments, a resistor 510 is electrically coupled to the second terminal of the first switch 221 and the control electrode of the second transistor 212. A first terminal of the resistor 510 is electrically coupled to the second terminal of the first switch 221. A second terminal of the resistor 510 is electrically coupled to the control electrode of the second transistor 212.

Figure 6:
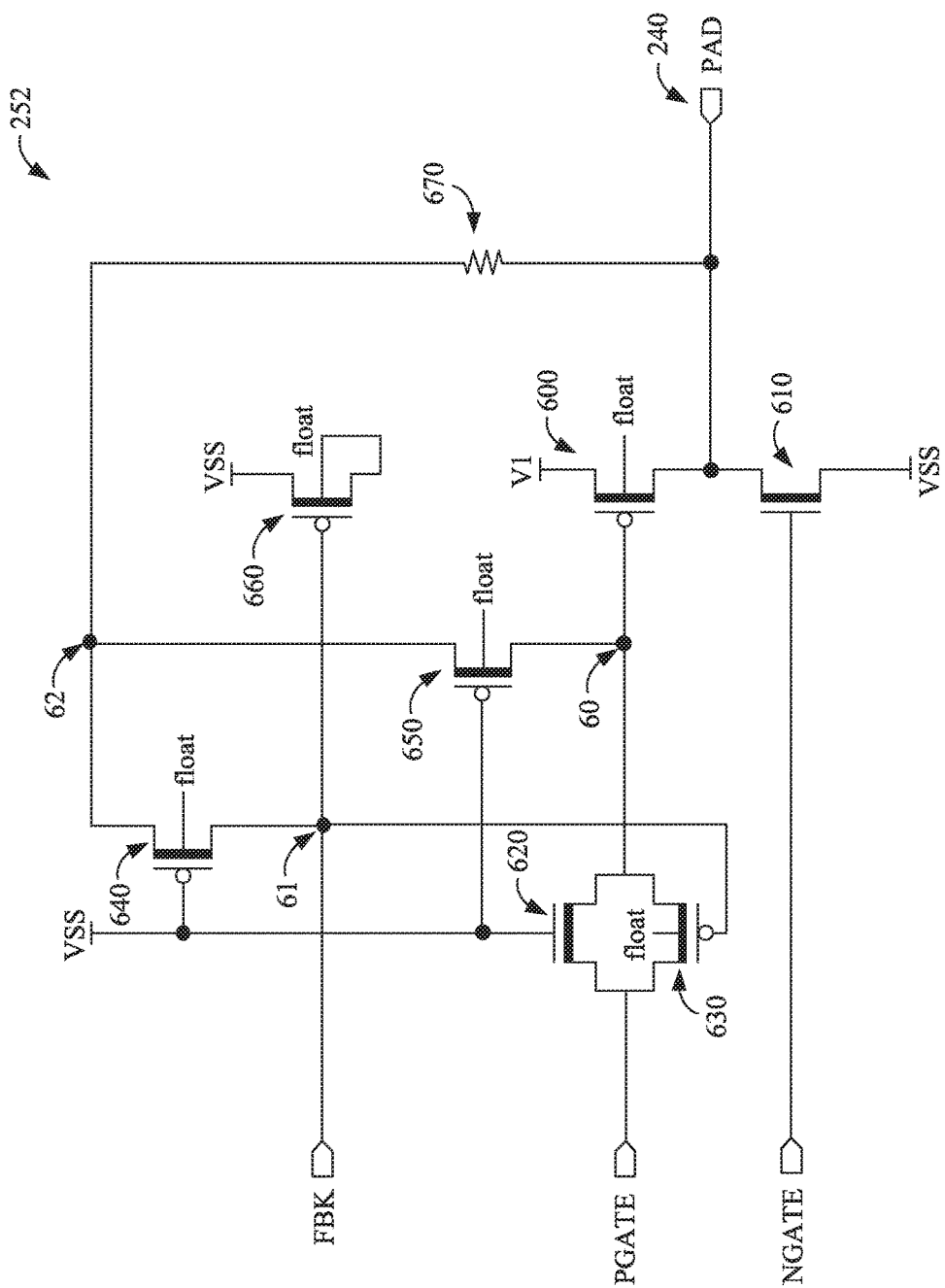
FIG. 6 is a diagram of a feedback circuit in accordance with one or more embodiments.

FIG. 6 is a diagram of the feedback circuit 252, in accordance with one or more embodiments. In some embodiments, a drain electrode of a transistor 600 is electrically coupled to the pad 240. A source electrode of the transistor 600 is electrically coupled to the first voltage source. A gate electrode of the transistor 600 is electrically biased by voltage at a node 60. In some embodiments, a bulk of the transistor 600 is electrically floating. In some embodiments, the transistor 600 is a PMOS transistor. In some embodiments, a drain electrode of a transistor 610 is electrically coupled to the drain electrode of the transistor 600. A source electrode of the transistor 610 is electrically coupled to the third voltage source. A gate electrode of the transistor 610 is electrically coupled to a first input terminal that carries an electrical signal NGATE. In some embodiments, the transistor 610 is an NMOS transistor.

In some embodiments, a pass gate of the feedback circuit 252 includes a transistor 620 and a transistor 630. A source electrode of the transistor 620 is electrically coupled to the gate electrode of the transistor 600. A drain electrode of the transistor 620 is electrically coupled to a second input terminal that carries an electrical signal PGATE. A gate electrode of the transistor 620 is electrically coupled to the third voltage source. In some embodiments, the transistor 620 is an NMOS transistor. A source electrode of the transistor 630 is electrically coupled to the second input terminal. A drain electrode of the transistor 630 is electrically coupled to the gate electrode of the transistor 600. A gate electrode of the transistor 630 is electrically coupled to the fourth terminal (node 61) of the feedback circuit 252. A bulk of the transistor 630 is electrically floating. In some embodiments, the transistor 630 is a PMOS transistor.

Transistors 640, 650 and resistor 670 provide feedback control within the feedback circuit 252, as well as to the pull-up circuit 210 through the fourth terminal. In some embodiments, a first terminal of the resistor 670 is electrically coupled to the pad 240. A second terminal of the resistor 670 is electrically coupled to a source electrode of the transistor 640 and a source electrode of the transistor 650 (node 62). A drain electrode of the transistor 640 is electrically coupled to the fourth terminal. A drain electrode of the transistor 650 is electrically coupled to the gate electrode of the transistor 600. In some embodiments, a bulk of the transistor 640 is electrically floating. In some embodiments, a bulk of the transistor 650 is electrically floating. In some embodiments, the transistor 640 is a PMOS transistor. In some embodiments, the transistor 640 is a PMOS transistor. In some embodiments, the feedback circuit 252 further comprises a transistor 660. A source electrode of the transistor 660 is electrically coupled to the third voltage source. A drain electrode and a bulk of the transistor 660 are electrically floating. A gate electrode of the transistor 660 is electrically coupled to the fourth terminal (the node 61). In some embodiments, the transistor 660 is a PMOS transistor.

During a failsafe period, if voltage on the pad 240 transitions from low to high (e.g., to 1.8 Volts from floating or ground), the transition in the voltage is coupled to the nodes 60, 61 and/or 62 through the resistor 670 and the transistors 650, 640. Voltage at the fourth terminal (the feedback signal FBK) is coupled high (e.g., to about 1.8 Volts). The high voltage at the fourth terminal turns off the first transistor 211 of the pull-up circuit 210 through the switch 222 (or the switch 422). The high voltage at the fourth terminal also turns off the transistor 630. The voltage at the node 60 further turns off the transistor 600.

Figure 7:
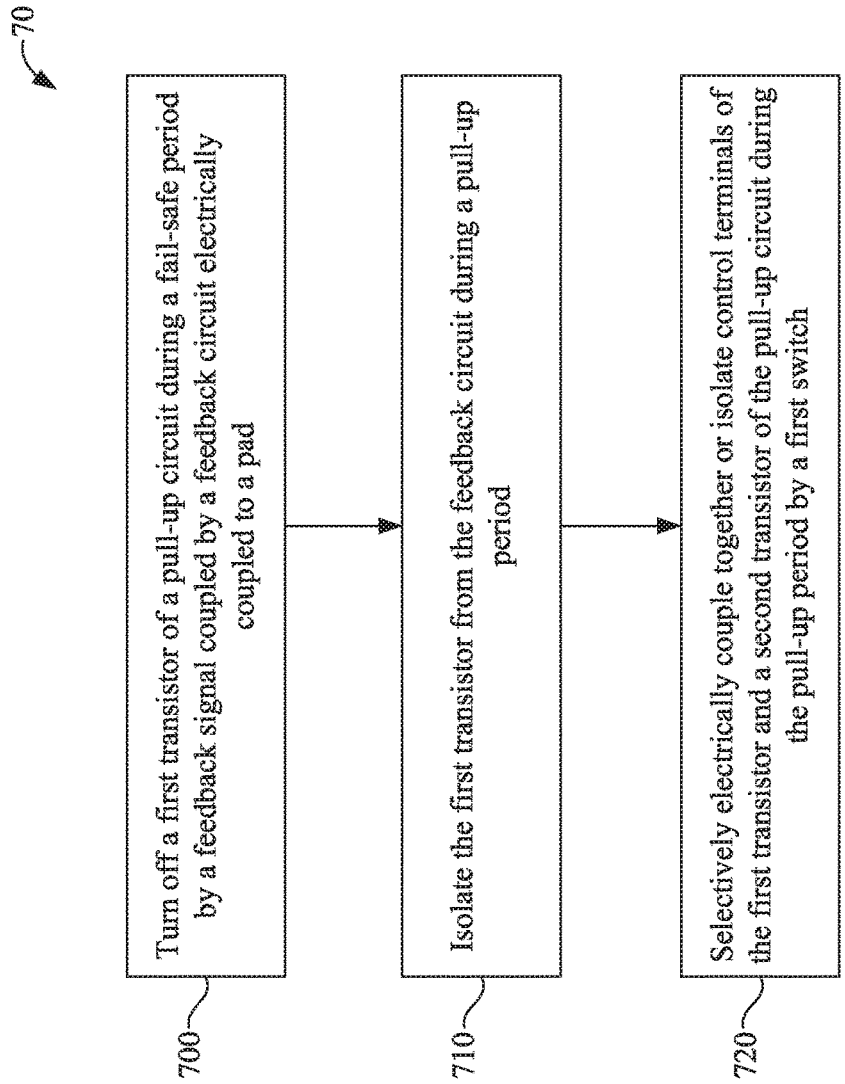
FIG. 7 is a flowchart of a method of operating a device with failsafe functionality in accordance with one or more embodiments.

FIG. 7 is a flowchart of a method 70 of operating a device (e.g., the device 10) with failsafe functionality. Reference to the FIGS. 2-6 is made for illustrative purposes, but the method 70 should not be construed as limited to the circuits 20, 30, 40, 50.

Failsafe conditions (or "modes") may arise during operation of an IC chip (e.g., the IC chip 100, 110 or 120 of FIG. 1). A period of time over which the failsafe condition(s) or mode(s) occur is a failsafe period. In some embodiments, the circuits described here are designed to ensure that circuit reliability is maintained, even in the presence of supply voltage failure, or high voltage signal levels at I/O pins. Certain examples of failsafe conditions are identified herein, including: open input pins, idle bus, and shorted input pins.

In step 700, a first transistor of a pull-up circuit (e.g., the first transistor 211 of the pull-up circuit 210) is turned off during a failsafe period by a feedback signal (e.g., the feedback signal FBK) coupled by a feedback circuit that is electrically coupled to a pad (e.g., the feedback circuit 252 electrically coupled to the pad 240). In some embodiments, the first transistor is a PMOS transistor, and the feedback signal is a voltage signal at a level sufficient to reduce source-gate voltage Vsg of the PMOS transistor below a predetermined threshold. In some embodiments, the predetermined threshold corresponds to an operating regime of the PMOS transistor. In some embodiments, the operating regime is a cutoff, subthreshold, or weak inversion region. In some embodiments, bulk and drain electrodes (terminals) of the first transistor of the pull-up circuit are electrically floating. In some embodiments, bulk and source electrodes (terminals) of a second transistor (e.g., the second transistor 212) of the pull-up circuit are electrically floating.

In some embodiments, the feedback signal is switched in by a switch circuit (e.g., the second switch 222) to the gate electrode of the first transistor. In some embodiments, the switch circuit is a PMOS transistor. In some embodiments, the switch circuit is a pass gate (e.g., the pass gate 420 of FIG. 4). In some embodiments, a bulk terminal of the switch circuit is electrically floating. Being "switched in" indicates that the feedback signal passes through the switch circuit on the way to the gate electrode of the first transistor. The switch circuit may introduce some delay, a voltage drop, noise, or distortion in the feedback signal as received at the gate electrode versus as generated by the feedback circuit. Referring to FIG. 2, the first power node is biased by the first voltage V1. In the failsafe period, the first voltage V1 is ground or floating. When the feedback signal FBK transitions to a relatively positive voltage, the second switch 222 is turned on (Vsg>Vthp, where "Vthp" is P-type threshold voltage). The feedback signal FBK, being at a higher voltage than the first voltage V1, turns off the first transistor 211 (Vsg<Vthp). In some embodiments, the first switch 221 is turned off during the failsafe period.

In step 710, the first transistor is isolated from the feedback circuit during a pull-up period. The pull-up period is a period of time during which the pull-up circuit is operating normally, and not in a failsafe mode. Operating normally includes, for example, a non-zero or non-floating bias (e.g., about 0.9 Volts, 1.8 Volts, 2.5 Volts, or the like) being applied across power terminals (e.g., the first and second power nodes) of the pull-up circuit. In some embodiments, the first transistor is isolated by deactivating (turning off, opening) the switch circuit (e.g., the second switch 222). In some embodiments, the first transistor is isolated from the feedback circuit by deactivating (turning off, opening) a pass gate (e.g., the pass gate 420).

With the gate electrode of the first transistor isolated from the feedback circuit during the pull-up period, the pull-up circuit is configured to operate normally under proper biasing conditions. In step 720, a first switch (e.g., the first switch 221) selectively electrically couples or isolates the gate electrodes of the first transistor and the second transistor of the pull-up circuit. In some embodiments, a level shifter (e.g., the level shifter 230) controls the selective electrical coupling or isolating based on an enable signal (e.g., the enable signal EN). In some embodiments, when the enable signal is of a first logic level (e.g., logic high), the level shifter outputs a voltage that turns off the first switch to isolate the gate electrode of the first transistor from the gate electrode of the second transistor. In some embodiments, when the enable signal is of a second logic level (e.g., logic low), the level shifter outputs a voltage that turns on the first switch to electrically couple the gate electrode of the first transistor to the gate electrode of the second transistor. In some embodiments, the first switch is an NMOS transistor, the voltage that turns on the first switch is higher than a threshold voltage of the NMOS transistor, and the voltage that turns off the first switch is lower than the threshold voltage of the NMOS transistor. In some embodiments, the level shifter further outputs a voltage to the gate electrode of the second transistor of the pull-up circuit. The voltage outputted to the gate electrode of the second transistor is an inverse voltage of the voltage outputted to the first switch.

For example, if the voltage outputted to the first switch is a high voltage (e.g., 0.9 Volts, 1.8 Volts, or the like), the voltage outputted to the second transistor is a low voltage (e.g., 0 Volts), and vice versa. Referring to FIG. 2, the first switch (e.g., the NMOS transistor 221) turns on, and the voltage at the gate electrode of the second transistor (e.g., the second transistor 212) is low (e.g., 0 Volts). The low voltage at the gate electrode of the second transistor pulls down voltage at the gate electrode of the first transistor (e.g., the first transistor 211), and the first transistor and the second transistor both turn on. With the first and second transistors turned on, voltage at a pad (e.g., the pad 240) electrically coupled to the pull-up circuit is pulled up to the first voltage V1 (e.g., 1.8 Volts, or the like).

The circuits 20, 30, 40, 50 and the method 70 provide failsafe functionality while maintaining full-swing during normal operation. Leakage current is also reduced versus other approaches. For example, the discussed pull-up circuit uses the control circuit and the level shifter to provide the failsafe mode and near full-swing output voltage.

In accordance with various embodiments of the present disclosure, a method includes turning off a first transistor of a pull-up circuit during a failsafe period by a feedback signal, the feedback signal being received by way of a feedback circuit. The method further includes isolating the first transistor from the feedback circuit during a pull-up period and coupling or isolating a control terminal of the first transistor and a control terminal of a second transistor of the pull-up circuit during the pull-up period by a first switch.

In accordance with various embodiments of the present disclosure, a method includes electrically connecting a control terminal of a first switch with a control terminal of a second switch during a pull-up period. A supply voltage node is electrically connected to a circuit node through a pull-up circuit comprising the first switch and the second switch. The method further includes electrically isolating a feedback signal terminal from the first switch during the pull-up period. The control terminal of the first switch is electrically isolated from the control terminal of the second switch during a failsafe period. The method further includes electrically connecting the feedback signal terminal to the control terminal of the first switch during the failsafe period.

In accordance with various embodiments of the present disclosure, a method includes electrically connecting a supply voltage node to a circuit node through a pull-up circuit during a pull-up period. The method further includes opening, during the pull-up period, a first switch having a feedback terminal and an opposite terminal electrically connected to the pull-up circuit. A first voltage is applied to a second switch during the pull-up period, and the second switch is electrically connected to a first control terminal of the pull-up circuit and to a second control terminal of the pull-up circuit. The method further includes applying a second voltage, different from the first voltage, to the pull-up circuit during the pull-up period and electrically isolating the supply voltage node from the circuit node during a failsafe period.

As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising". Moreover, the term "between" as used in this application is generally inclusive (e.g., "between A and B" includes inner edges of A and B).

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   turning off a first transistor of a pull-up circuit during a failsafe period by a feedback signal, the feedback signal being received by way of a feedback circuit;
   isolating the first transistor from the feedback circuit during a pull-up period; and
   selectively electrically coupling together or isolating a control terminal of the first transistor and a control terminal of a second transistor of the pull-up circuit during the pull-up period by a first switch.

2. The method of claim 1, further comprising activating the first switch by a level shifter electrically coupled to the first switch.

3. The method of claim 2, further comprising:
   electrically coupling the control terminal of the first transistor and the control terminal of the second transistor of the pull-up circuit during the pull-up period by the first switch, the first switch being in series with a resistor.

4. The method of claim 1, further comprising deactivating a second switch to isolate the first transistor from the feedback circuit.

5. The method of claim 4, wherein the deactivating comprises biasing a control terminal of the second switch by a core voltage.

6. The method of claim 4, further comprising:
   electrically floating a bulk terminal and a drain terminal of the first transistor of the pull-up circuit;
   electrically floating a bulk terminal and a source terminal of the second transistor of the pull-up circuit electrically coupled to the first transistor; and
   electrically floating a bulk terminal of the second switch.

7. The method of claim 6, further comprising pulling up a voltage of a pad coupled to the feedback circuit to a voltage level equal to a voltage level of a power node electrically coupled to a source terminal of the first transistor.

8. The method of claim 1, further comprising deactivating a pass gate to isolate the first transistor from the feedback circuit.

9. A method comprising:
   electrically connecting a control terminal of a first switch with a control terminal of a second switch during a pull-up period, wherein a supply voltage node is electrically connected to a circuit node through a pull-up circuit comprising the first switch and the second switch;
electrically isolating a feedback signal terminal from the first switch during the pull-up period;
electrically isolating the control terminal of the first switch from the control terminal of the second switch during a failsafe period; and
electrically connecting the feedback signal terminal to the control terminal of the first switch during the failsafe period.

10. The method of claim 9, wherein the connecting the control terminal of the first switch with the control terminal of the second switch during the pull-up period comprises closing a third switch electrically connected to the first switch and the second switch.

11. The method of claim 10, wherein the closing the third switch comprises receiving at the third switch a first control signal from a level shifter.

12. The method of claim 11, further comprising applying a second control signal from the level shifter to the control terminal of the second switch.

13. The method of claim 12, wherein a voltage level of the first control signal is different from a voltage level of the second control signal.

14. The method of claim 9, further comprising electrically floating a bulk terminal and a drain terminal of the first switch.

15. The method of claim 9, further comprising electrically floating a bulk terminal and a source terminal of the second switch.

16. A method comprising:
electrically connecting a supply voltage node to a circuit node through a pull-up circuit during a pull-up period;
opening, during the pull-up period, a first switch having a feedback terminal and a terminal electrically connected to the pull-up circuit;
applying a first voltage to a second switch during the pull-up period, wherein the second switch is electrically connected to a first control terminal of the pull-up circuit and to a second control terminal of the pull-up circuit;
applying a second voltage, different from the first voltage, to the pull-up circuit during the pull-up period; and
electrically isolating the supply voltage node from the circuit node during a failsafe period.

17. The method of claim 16, wherein the first voltage and the second voltage are based on a state of an enable signal.

18. The method of claim 17, further comprising receiving the enable signal at a level shifter.

19. The method of claim 16, wherein the electrically connecting the supply voltage node to the circuit node comprises reducing a source-gate voltage of a P-type metal-oxide-semiconductor (PMOS) transistor of the pull-up circuit.

20. The method of claim 19, further comprising electrically a floating bulk terminal and a source terminal of the PMOS transistor.

* * * * *